(12) United States Patent
Takei et al.

(10) Patent No.: US 7,777,398 B2
(45) Date of Patent: Aug. 17, 2010

(54) PIEZOELECTRIC ACTUATOR

(75) Inventors: Shodo Takei, Nagaokakyo (JP);
Hidekiyo Takaoka, Omihachiman (JP);
Shigeharu Kasai, Toyama (JP); Koichi Hayashi, Kusatsu (JP); Shizuharu Watanabe, Omihachiman (JP)

(73) Assignee: Murata Manufacturing Co., Ltd., Nagaokakyo-shi, Kyoto-fu (JP)

( * ) Notice: Subject to any disclaimer, the term of this patent is extended or adjusted under 35 U.S.C. 154(b) by 0 days.

(21) Appl. No.: 11/857,599

(22) Filed: Sep. 19, 2007

(65) Prior Publication Data
US 2008/0007144 A1  Jan. 10, 2008

Related U.S. Application Data

(63) Continuation of application No. PCT/JP2007/054936, filed on Mar. 13, 2007.

(30) Foreign Application Priority Data
Mar. 31, 2006  (JP) .............................. 2006-097575

(51) Int. Cl.
*H01L 41/047* (2006.01)
(52) U.S. Cl. .................... 310/365; 310/363; 310/364; 310/366; 310/328
(58) Field of Classification Search ............... 310/363, 310/364, 365, 366, 328
See application file for complete search history.

(56) References Cited

U.S. PATENT DOCUMENTS 6,396,193 B1 *  5/2002  Takeuchi et al. ............. 310/321
6,522,052 B2 *  2/2003  Kihara et al. ................ 310/366

(Continued)

FOREIGN PATENT DOCUMENTS

JP  2002-061551  2/2002
JP  2002-261339  9/2002

(Continued)

OTHER PUBLICATIONS

PCT/JP2007/054936 Written Opinion dated May 29, 2007.

(Continued)

*Primary Examiner*—Walter Benson
*Assistant Examiner*—Bryan P Gordon
(74) *Attorney, Agent, or Firm*—Dickstein, Shapiro, LLP.

(57) ABSTRACT

A piezoelectric actuator includes external conductors formed on an outer surface of a piezoelectric component. The external conductors each include a thick-film conductor and a conductive reinforcer. The thick-film conductor is provided with a first thick-film conductor formed on the outer surface of the piezoelectric component, second thick-film conductors which are formed on part of an outer surface of the first thick-film conductor and which are in surface-contact with the outer surface of the first thick-film conductor. The conductive reinforcer is attached to outer surfaces of the second thick-film conductors.

20 Claims, 5 Drawing Sheets

U.S. PATENT DOCUMENTS

| | | | |
|---|---|---|---|
| 6,891,316 B2 * | 5/2005 | Yuu et al. | 310/363 |
| 7,249,817 B2 * | 7/2007 | Vines et al. | 347/15 |
| 2001/0047796 A1 | 12/2001 | Yamada et al. | |
| 2002/0149300 A1 * | 10/2002 | Kaitila et al. | 310/364 |
| 2003/0067515 A1 * | 4/2003 | Sugahara | 347/71 |
| 2006/0232170 A1 | 10/2006 | Takaoka et al. | |
| 2006/0232172 A1 * | 10/2006 | Asano et al. | 310/366 |
| 2007/0048190 A1 * | 3/2007 | Ifuku et al. | 422/100 |
| 2007/0164638 A1 * | 7/2007 | Kadotani et al. | 310/363 |

FOREIGN PATENT DOCUMENTS

| | | |
|---|---|---|
| JP | 2003-502870 | 1/2003 |
| JP | 2004-288548 A | 10/2004 |
| JP | 2005-183478 | 7/2005 |
| JP | 2005-320224 A | 11/2005 |
| WO | WO 2005/064700 | 7/2005 |

OTHER PUBLICATIONS

PCT/JP2007/054936 International Search Report dated Mar. 13, 2007.

* cited by examiner

PIEZOELECTRIC ACTUATOR

CROSS REFERENCE TO RELATED APPLICATIONS

The present application is a continuation of International Application No. PCT/JP2007/054936, filed Mar. 13, 2007, which claims priority to Japanese Patent Application No. JP2006-097575, filed Mar. 31, 2006, the entire contents of each of these applications being incorporated herein by reference in their entirety.

FIELD OF THE INVENTION

The present invention relates to piezoelectric actuators used for the operation of electronic devices, such as magnetic heads, and mechanical elements such as valves. Specifically, the present invention relates to a piezoelectric actuator in which an external conductor is arranged on an outer surface of a piezoelectric component.

BACKGROUND OF THE INVENTION

Hitherto, piezoelectric actuators have been used for the operation of various electronic devices and mechanical elements. Piezoelectric actuators each include a piezoelectric component and external conductors arranged on outer surfaces of the piezoelectric component and used for applying a voltage to the piezoelectric component.

Known examples of the above-described piezoelectric component include single-layer piezoelectric components each composed of a single piezoelectric component; and multilayer piezoelectric components each composed of a plurality of piezoelectric layers stacked. Piezoelectric actuators include piezoelectric components having structures suitable for applications.

The external conductors are usually composed of high-reliability thick-film conductor. In general, each external conductor is formed by applying a conductive paste to a surface of a piezoelectric component and baking the paste, the conductive paste being formed by kneading a metal powder such as a Ag powder, a glass frit, an organic resin binder, and an organic solvent.

In a piezoelectric actuator, a piezoelectric component expands and contracts repeatedly during operation. The piezoelectric component is repeatedly displaced for long-term operation. Thus, a stress due to displacement is repeatedly applied to external conductors. The long-term operation of the piezoelectric actuator may cause fatigue of the external conductor to form a crack in the external conductor, leading to the fracture of the external conductor. The formation of a crack in or fracture of the external conductor impairs the conductivity of the external conductor. As a result, the piezoelectric actuator cannot operate.

To overcome the foregoing problems, Patent Document 1 described below discloses a multilayer piezoelectric part 101 shown in FIG. 6. In the multilayer piezoelectric part 101, internal electrodes 103a and 103b are formed in a multilayer piezoelectric component 102. An external conductor 104 is formed so as to be electrically connected to the internal electrode 103a.

The external conductor 104 has a structure in which a Ag-wire gauze 104b is embedded in a thick-film conductor 104a mainly composed of a Ag powder. The embedment of the wire gauze 104b increases the mechanical strength of the external conductor 104.

Patent Document 2 discloses a piezoelectric actuator 111 shown in FIG. 7 that is a schematic fragmentary cross-sectional view. The piezoelectric actuator 111 includes an external conductor 113 formed on an outer surface of a multilayer piezoelectric component 112. The external conductor 113 includes an external electrode 114 which is formed directly on the outer surface of the multilayer piezoelectric component 112 and which is composed of a thick-film conductor; and a meshed metal member 115 attached by brazing or welding to the outer surface of the external electrode 114. That is, the netted metal member 115 is contact-connected to the outer surface of the external electrode 114.

Patent Document 1: WO2005/064700 A1
Patent Document 2: Japanese Unexamined Patent Application Publication No. 2003-502870

In the multilayer piezoelectric part 101 described in Patent Document 1, the formation of a crack in the thick-film conductor 104a applies a stress to the wire gauze 104b integrally embedded in the thick-film conductor 104a, thus possibly causing fracture of the wire gauze 104b in association with the crack formed in the thick-film conductor 104a. That is, the wire gauze 104b has an insufficient reinforcing effect.

On the other hand, in the piezoelectric actuator 111 described in Patent Document 2, the meshed wire member 115 is contact-connected to the outer surface of the external electrode 114. However, adhesion by such contact connection is not sufficient. Thus, disadvantageously, the repeated displacement of the multilayer piezoelectric component 112 easily results in detachment at the contact connection. In particular, in the case where the metal member 115 is contact-connected to the external electrode 114 located at the outer surface of a portion in which the piezoelectric component is largely displaced, the external electrode 114 is restricted to contact connection. Thus, after the repetition of displacement, a crack is more easily formed at the portion of the external electrode 114 restricted to contact connection.

SUMMARY OF THE INVENTION

In consideration of the above-described situation in the known art, it is an object of the present invention to provide a high-reliability piezoelectric actuator including an external conductor formed of a thick-film conductor and arranged on an outer surface of a piezoelectric component, wherein even repeated displacement of the piezoelectric component for long-term operation does not easily cause faulty conduction of the external conductor.

According to the present invention, a piezoelectric actuator includes a piezoelectric component having a piezoelectric ceramic layer; and an external conductor arranged on at least one main surface of the piezoelectric component, wherein the external conductor has a thick-film conductor and a conductive reinforcer, the thick-film conductor is provided with a planar-shaped first thick-film conductor arranged on at least one main surface of the piezoelectric component and is provided with a second thick-film conductor arranged on part of the first thick-film conductor, the second thick-film conductor being in surface-contact with the first thick-film conductor, and the conductive reinforcer is attached to an outer surface of the second thick-film conductor so as not to be in direct contact with the first thick-film conductor.

In an aspect of the piezoelectric actuator according to the present invention, the first thick-film conductor has a thickness larger than that of the second thick-film conductor. Thus, detachment at the bonding portion of the first thick-film conductor and the second thick-film conductor is further suppressed.

In another aspect of the piezoelectric actuator according to the present invention, each of the thick-film conductors is formed by baking a conductive paste containing a metal powder, a glass frit, and an organic vehicle, and the total content of the metal powder and the glass frit is in the range of 85 to 95 percent by weight relative to the conductive paste. In this case, adhesion strength between the piezoelectric component and the first thick-film conductor and between the conductive reinforcer and the second thick-film conductor is more effectively increased. Thus, faulty conduction of the external conductor is still further suppressed.

In another aspect of the piezoelectric actuator according to the present invention, the plurality of second thick-film conductors are arranged to have a frame-like shape in plan. In this case, since the plurality of second thick-film conductor are arranged to have a frame-like shape in plan, adhesion strength between the second thick-film conductors and the first thick-film conductor and between the second thick-film conductors and the conductive reinforcer are further increased. In this case, preferably, the piezoelectric actuator has four strip-shaped thick-film conductors as the plurality of second thick-film conductors, and the four strip-shaped thick-film conductors are arranged to have a rectangular frame-like shape. In this case, adhesion strength between the second thick-film conductors and the first thick-film conductor and between the second thick-film conductors and the conductive reinforcer are still further increased.

In another aspect of the piezoelectric actuator according to the present invention, the first and second thick-film conductors are arranged in such a manner that the peripheral line of the second thick-film conductor is located inside the peripheral line of the first thick-film conductor, and a step is formed inside the peripheral line of the external conductor. The presence of the step disperses a stress applied to the external conductor at the peripheral line of the external conductor, thereby more surely suppressing a crack in and fracture of the external electrode.

In the piezoelectric actuator according to the present invention, the external conductor is formed on the at least one main surface of the piezoelectric component. The external conductor includes the thick-film conductor and the conductive reinforcer. The thick-film conductor is provided with the planar-shaped first thick-film conductor and the plurality of second thick-film conductors which are formed on part of the first thick-film conductor and which are in surface-contact with the first thick-film conductor. The conductive reinforcer is attached to the outer surfaces of the second thick-film conductors so as not to be in direct contact with the first thick-film conductor. Thus, sufficiently high adhesion strength is provided between the first thick-film conductor and the second thick-film conductor. In addition, the conductive reinforcer is not directly attached to the first thick-film conductor. Thus, even when the first thick-film conductor is cracked, the conductive reinforcer is not easily affected by the crack. As a result, the conductive reinforcer is not easily broken. That is, the conductive reinforcer ensures the continuity of the external conductor in the planar direction. Thus, even in the case where the piezoelectric actuator is driven for a long period and where the piezoelectric component expands and contracts repeatedly to apply displacement due to expansion and contraction to the external conductor, detachment at the bonding portions between the first and second thick-film conductors and between the thick-film conductor and the conductive reinforcer is suppressed. Thus, faulty conduction of the external conductor is suppressed in the piezoelectric actuator, thereby effectively improving the reliability of the piezoelectric actuator.

Figure 1:
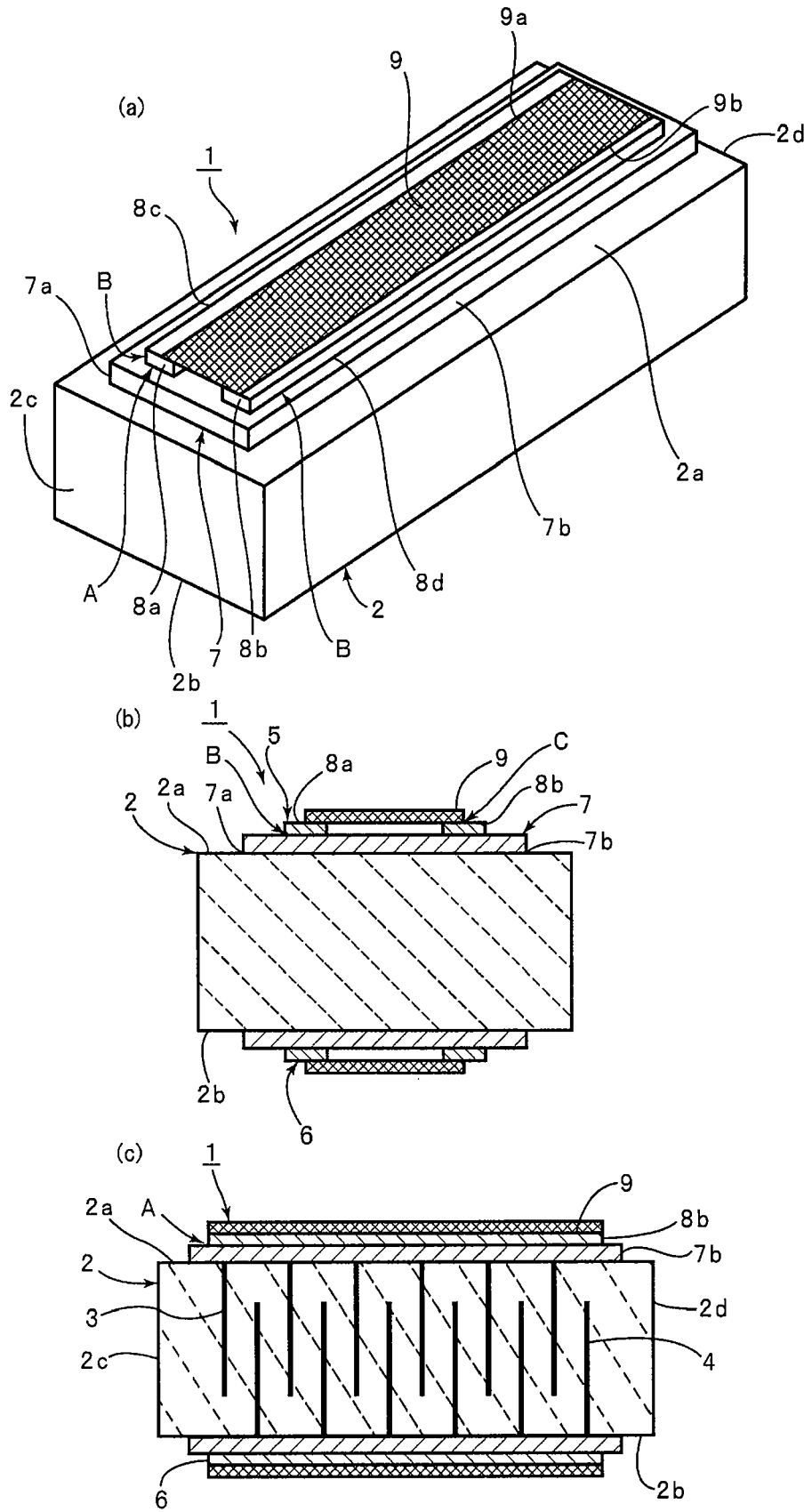
FIGS. 1(a), 1(b), and 1(c) are a perspective view, a cross-sectional view, and a longitudinal sectional view, respectively, of a piezoelectric actuator according to a first embodiment of the present invention.

REFERENCE NUMERALS 1 piezoelectric actuator
2 piezoelectric component
2a top face
2b bottom face
2c, 2d side face
3 internal electrode
4 internal electrode
5 external electrode
6 external electrode
7 first thick-film conductor segment
8a, 8b second thick-film conductor segment
9 conductive reinforcer
11 piezoelectric actuator
15, 16 external conductor
17 first thick-film conductor
18a to 18d second thick-film conductor

DESCRIPTION OF THE INVENTION

The present invention will be apparent from the description of specific embodiments of the present invention with reference to the drawings.

FIGS. 1(a), 1(b), and 1(c) are a perspective view, a cross-sectional view, and a longitudinal sectional view, respectively, of a piezoelectric actuator according to a first embodiment of the present invention.

A piezoelectric actuator 1 includes a multilayer piezoelectric component 2 that is in the form of a rectangular parallelepiped. The multilayer piezoelectric component 2 has a top face 2a, a bottom face 2b, and side faces 2c and 2d. The direction in which the side face 2c is connected to the side face 2d is the longitudinal direction of the piezoelectric component 2. A plurality of first internal electrodes 3 and a plurality of second internal electrodes 4 are formed in the piezoelectric component 2 so as to extend in a direction parallel to the side faces 2c and 2d, i.e., so as to extend vertically.

The first internal electrodes 3 and the second internal electrodes 4 are alternately arranged in the direction in which the side face 2c is connected to the side face 2d. The plurality of first internal electrodes 3 extend to the top face 2a and do not reach the bottom face 2b. The plurality of second internal electrodes 4 extend to the bottom face 2b and do not reach the top face 2a. As shown in FIG. 1(c), the first and second internal electrodes 3 and 4 are arranged so as to overlap with each other at an intermediate position in height of the piezoelectric component 2.

The piezoelectric component 2 may be composed of an appropriate piezoelectric ceramic material such as a lead zirconate titanate ceramic material. The internal electrodes 3 and 4 are each composed of an appropriate metal such as Ag or an alloy such as Ag—Pd. The internal electrodes 3 and 4 may be formed by, for example, a thin-film-forming method or by applying a conductive paste on a green sheet of a piezoelectric ceramic material by printing.

Figure 2:
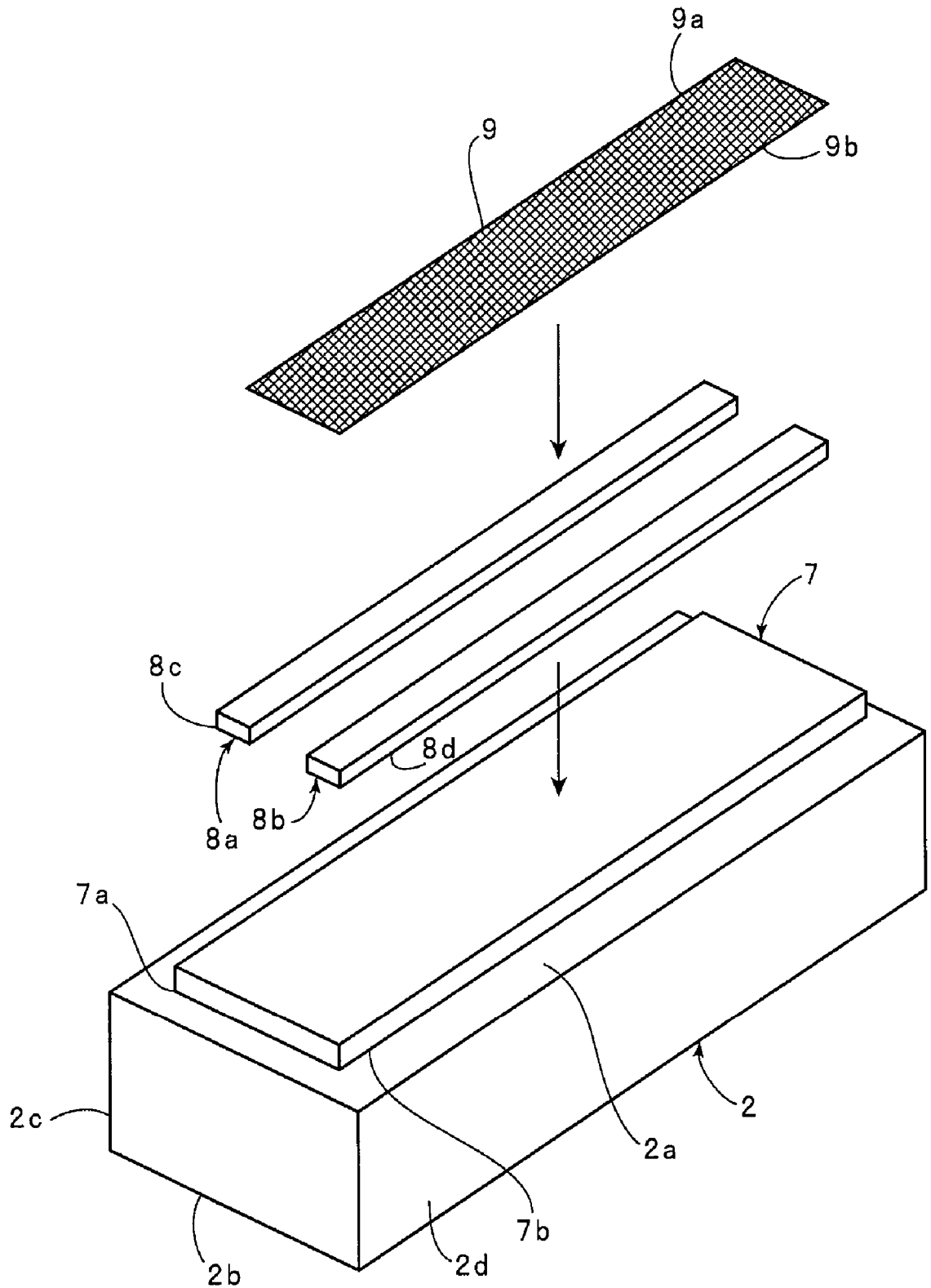
FIG. 2 is an exploded perspective view of the piezoelectric actuator according to the first embodiment.

A first external conductor 5 is arranged on the top face 2a. A second external conductor 6 is arranged on the bottom face 2b. The first external conductor 5 includes a thick-film conductor and a conductive reinforcer 9. The thick-film conductor includes a first thick-film conductor 7 formed directly on the top face 2a of the piezoelectric component 2; and a plurality of second thick-film conductors 8a and 8b formed on part of an outer surface of the first thick-film conductor 7, the second thick-film conductors 8a and 8b being in surface-contact with the outer surface. In this embodiment, the plurality of second thick-film conductor segments 8a and 8b each have a strip shape in plan as shown in FIG. 2 that is an exploded perspective view.

The second thick-film conductors 8a and 8b are arranged parallel to each other at predetermined intervals. The longitudinal length of each of the second thick-film conductors 8a and 8b is smaller than that of the first thick-film conductor 7 having a rectangular shape in plan. FIGS. 1(a) and 1(c) clearly show that an end of each of the second thick-film conductors 8a and 8b in the longitudinal direction is arranged inside the corresponding end of the first thick-film conductor 7 in the longitudinal direction. As a result, a step represented by Arrow A is formed.

Outer sides 8c and 8d of the plurality of strip-shaped second thick-film conductors 8a and 8b, the outer sides 8c and 8d being laterally located in the width direction of the external conductor 5, are arranged inside outer sides 7a and 7b of the first thick-film conductor 7 in the width direction. As a result, steps represented by Arrows B shown in FIGS. 1(a) and 1(b) are formed in the external conductor 5.

In this embodiment, the conductive reinforcer 9 is formed of a net member composed of a metal such as Ag. The conductive reinforcer 9 has a rectangular shape in plan. Outer sides 9a and 9b of the conductive reinforcer 9 in the width direction are arranged inside the outer sides of the second thick-film conductors 8a and 8b. As a result, a step C represented by Arrow C is formed on the external conductor 5.

The first thick-film conductor 7 and the second thick-film conductors 8a and 8b are formed by applying a conductive paste containing a metal powder, a glass frit, an organic vehicle, and a solvent and then baking the paste. Alternatively, the thick-film conductors 7, 8a, and 8b may be formed by another method.

Examples of the metal powder usable include appropriate metal powders such as a Ag powder and Ag—Pd alloy powders. Examples of the glass frit usable include appropriate glass frits such as borosilicate glass frits. Examples of the organic resin binder usable include organic resin binders, such as cellulose binders, e.g., ethyl cellulose, for use in appropriate conductive pastes.

Preferably, the first thick-film conductor 7 has a thickness larger than the thickness of each of the second thick-film conductors 8a and 8b, thereby increasing adhesion between the first thick-film conductor 7 and the piezoelectric component 2 and between the first thick-film conductor 7 and the second thick-film conductors 8a and 8b and thus more effectively suppressing faulty conduction.

The composition of the conductive paste is not particularly limited. Preferably, the conductive paste in which the total content of the metal powder and the glass frit is 85 to 95 percent by weight relative to the overall conductive paste containing the solvent is used. A total content of 85 percent by weight or more effectively increases adhesion between the resulting thick-film conductors, between the thick-film conductors and the conductive reinforcer, and between the first thick-film conductor and the piezoelectric component 2. A total content exceeding 95 percent by weight causes difficulty in forming the paste due to an excessively low content of the solvent.

In the multilayer piezoelectric actuator 1 according to this embodiment, the steps A and B are formed. Even when the multilayer piezoelectric component 2 expands and contracts repeatedly during operation, a stress due to expansion and contraction does not easily concentrate on a portion of the outer ends of the external conductor 5. That is, the external conductor 5 has the steps A and B. Hence, a stress applied is dispersed at the periphery of the external conductor 5. As a result, the formation of a crack in and detachment of the external conductor 5 are further suppressed.

Figure 3:
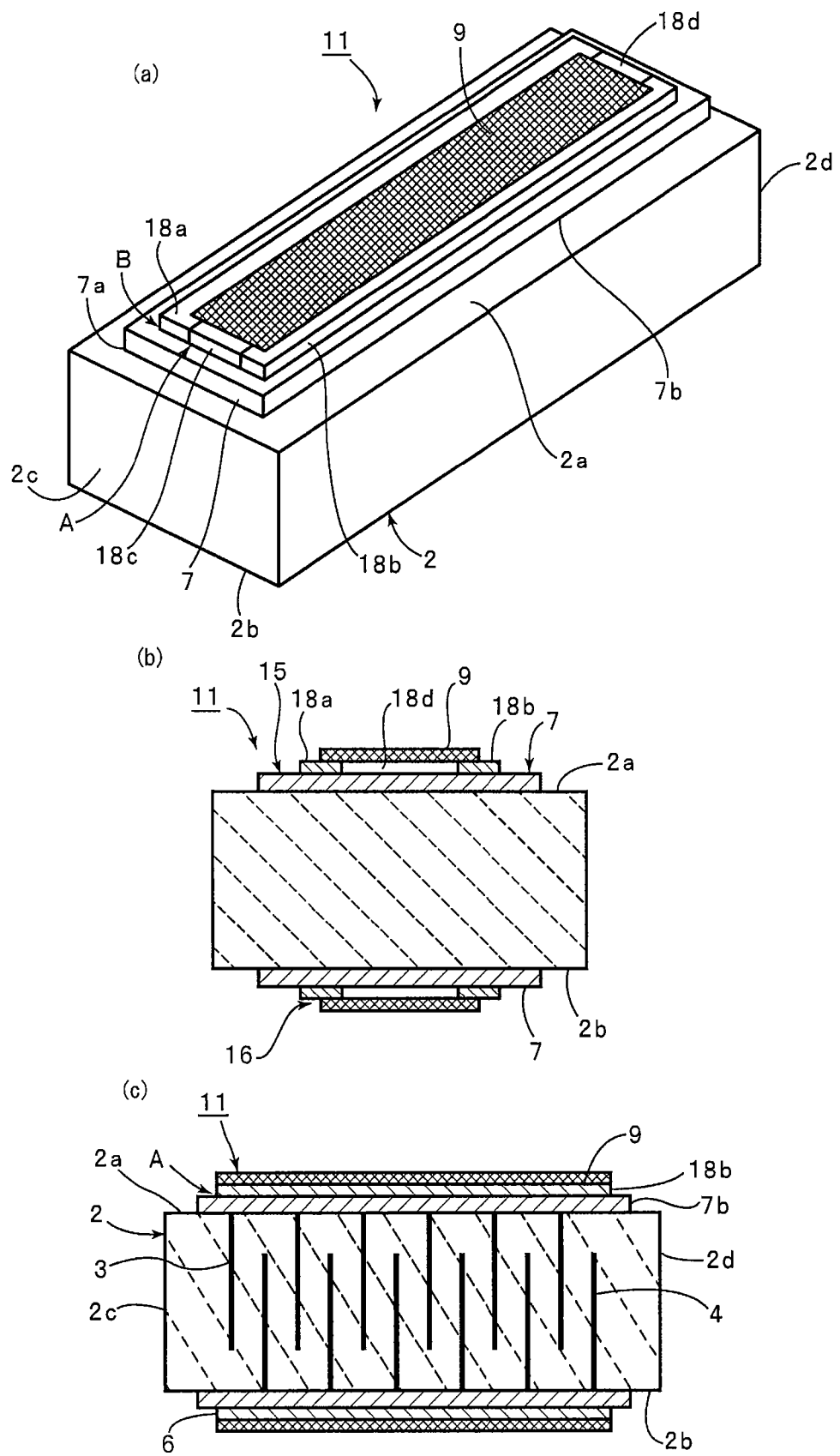
FIGS. 3(a), 3(b), and 3(c) are a perspective view, a cross-sectional view, and a longitudinal sectional view, respectively, of a piezoelectric actuator according to a second embodiment of the present invention.

FIGS. 3(a), 3(b), and 3(c) are a perspective view showing the appearance, a cross-sectional view, and a longitudinal sectional view, respectively, of a piezoelectric actuator according to a second embodiment of the present invention.

A piezoelectric actuator 11 according to the second embodiment includes the multilayer piezoelectric component 2 in the same way as in the piezoelectric actuator 1 according to the first embodiment. A first external conductor 15 is formed on the top face 2a of the piezoelectric component 2. A second external conductor 16 is formed on the bottom face 2b.

The difference between the piezoelectric actuator 11 according to the second embodiment and the piezoelectric actuator 1 according to the first embodiment is that in the external conductors 15 and 16, a plurality of second thick-film conductors 18a to 18d are arranged so as to have a rectangular frame-like shape. For the rest, the piezoelectric actuator 11 according to the second embodiment has the same structure as the piezoelectric actuator 1 according to the first embodiment. Like references designate identical elements, and description described in the first embodiment is also used.

Figure 4:
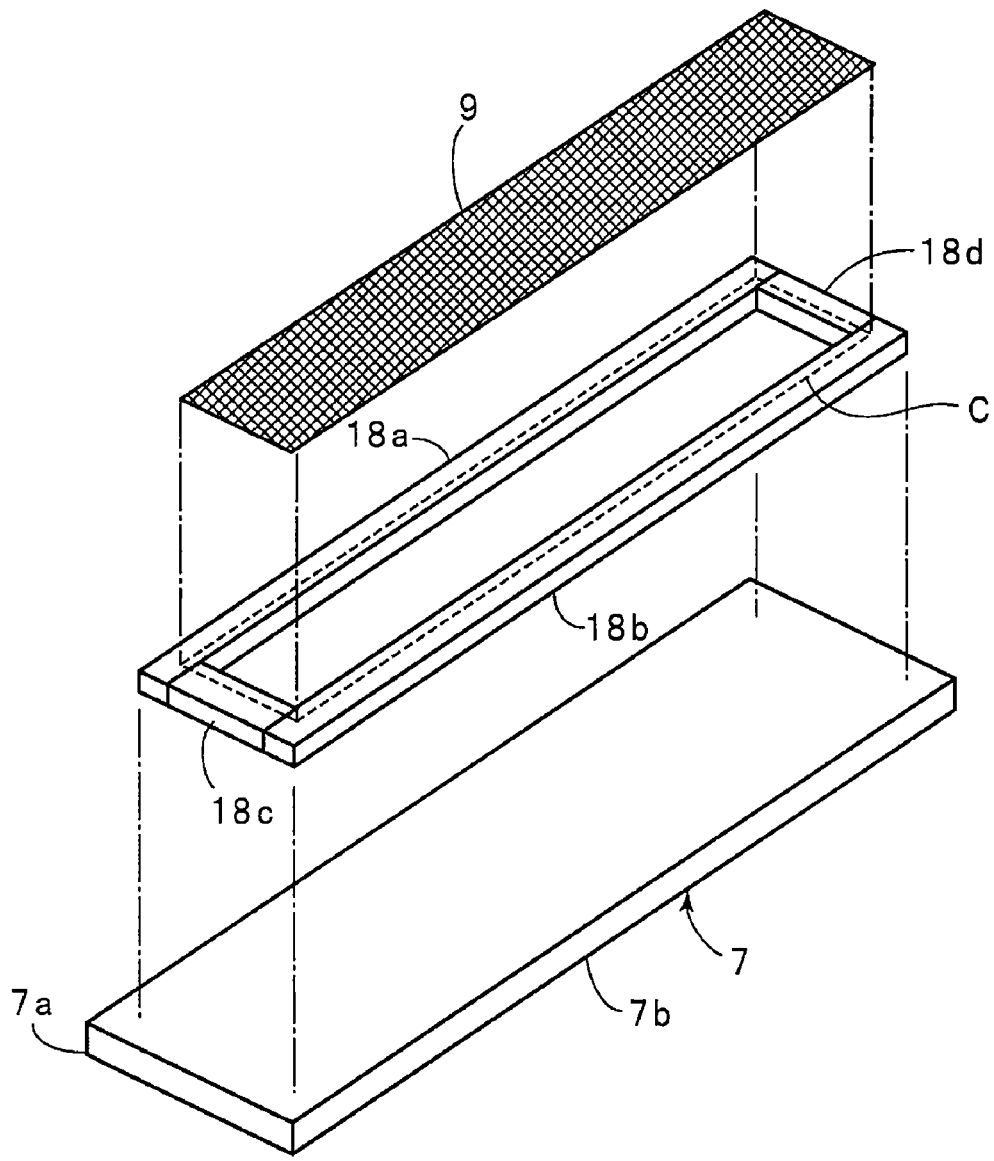
FIG. 4 is an exploded perspective view of the piezoelectric actuator according to the second embodiment.

As shown in FIG. 4, which is an exploded perspective view of the external conductor 15, the four strip-shaped second thick-film conductors 18a to 18d are formed on part of the first thick-film conductor 7 so as to be in surface-contact with the first thick-film conductor 7. In this case, the pair of strip-shaped second thick-film conductors 18a and 18b that extend in parallel with each other extend in the longitudinal direction of the piezoelectric component 2. The pair of second thick-film conductors 18c and 18d that extend in the direction orthogonal to the thick-film conductors 18a and 18b are arranged so as to connect ends of the thick-film conductors 18a and 18b in the longitudinal direction to form a rectangular frame-like shape.

Figure 5:
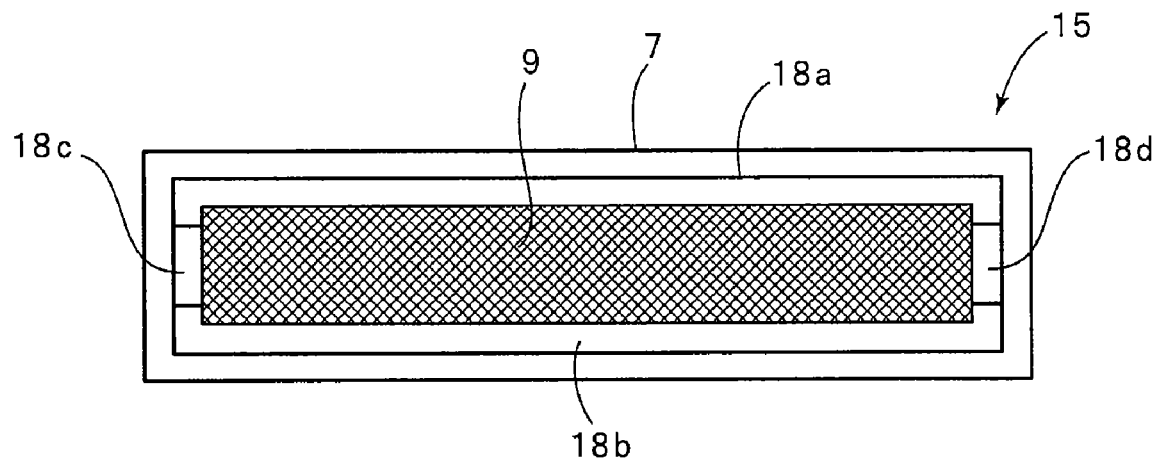
FIG. 5 is a plan view of the piezoelectric actuator according to the second embodiment.
Figure 6:
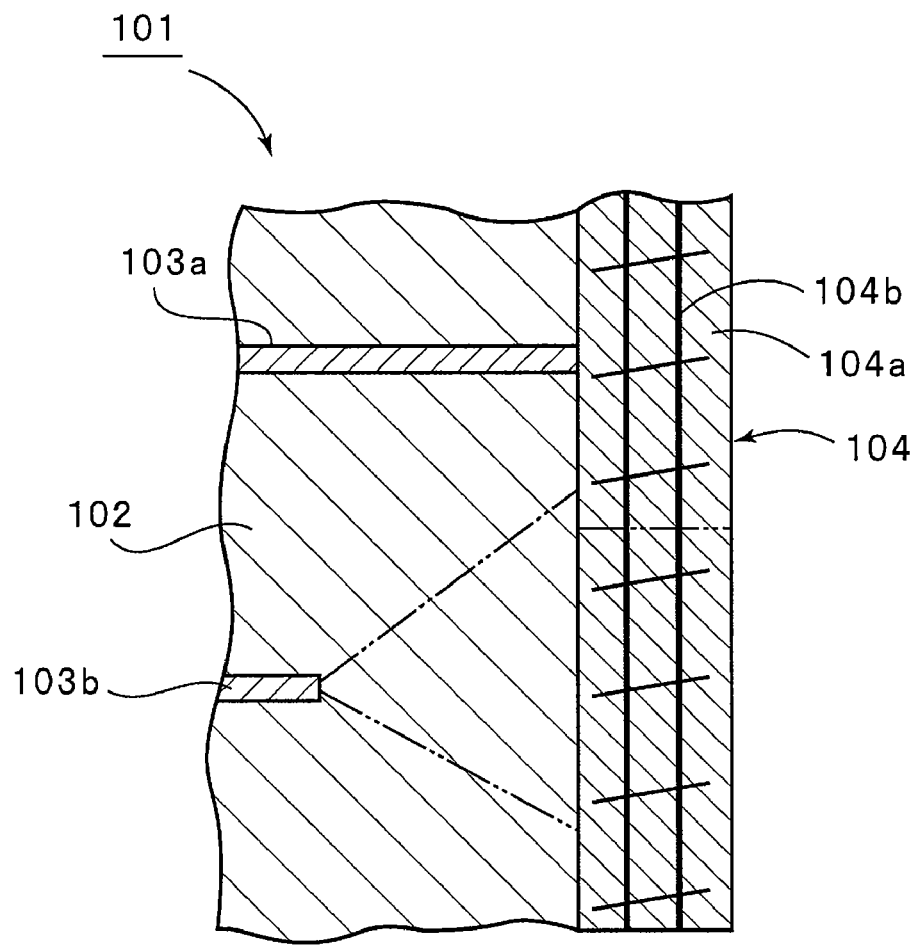
FIG. 6 is a fragmentary cross-sectional view of a known multilayer piezoelectric part.
Figure 7:
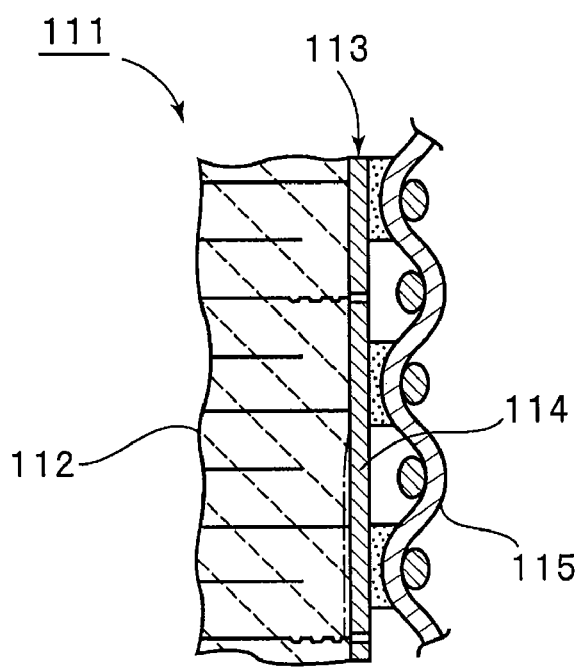
FIG. 7 is a schematic fragmentary cross-sectional view of an exemplary known piezoelectric actuator.

The conductive reinforcer 9 is attached to the second thick-film conductors 18a to 18d in such a manner that the peripheral line of the conductive reinforcer 9 is located on a position represented by Broken line C in FIG. 4 and that the conductive reinforcer 9 is in surface-contact with the second thick-film conductors 18a to 18d. FIG. 5 is a plan view of the external conductor 15.

In the piezoelectric actuator 11 according to the second embodiment, the plurality of second thick-film conductors 18a to 18d are arranged to have a frame-like shape in plan.

Thus, even when the multilayer piezoelectric component 2 is repeatedly displaced during operation, a partial detachment of and a crack in the external conductor 15 due to a displacement-induced stress are further suppressed. That is, the plurality of second thick-film conductors 18a to 18d are arranged to have the rectangular frame-like shape. Thus, in the displacement-induced stress applied, even when a stress is applied in the planar direction of the top face 2a of the piezoelectric component 2, the second thick-film conductors 18a to 18d are not easily deformed by the stress. Therefore, even when a stress resulting from the displacement of the multilayer piezoelectric component 2 is applied to the external conductor 15, a partial crack in and detachment of the first external conductor 15 is further suppressed.

In the second embodiment, the second thick-film conductors 18a to 18d are arranged to have the rectangular frame-like shape. Alternatively, the second thick-film conductors 18a to 18d may be arranged to have another polygonal frame-like shape other than a rectangle or a circular shape.

In the first and second embodiments, the steps A and B are formed. However, the present invention does not necessarily require the steps A and B. That is, the peripheral line of the second thick-film conductor need not necessarily be located inside the peripheral line of the first thick-film conductor. Similarly, the peripheral line of the conductive reinforcer need not necessarily be located inside the peripheral line of the second thick-film conductor. Preferably, as described above, the formation of the steps A and B as in the first and second equivalents more effectively prevents a partial crack in and detachment of the external conductor when a stress due to the displacement of the piezoelectric component 2 is applied.

In the second embodiment, the plurality of second thick-film conductors 18a to 18d are integrally formed to have the rectangular frame-like shape in plan. As will be apparent from examples described below, the second thick-film conductors 18a to 18d may be integrally formed by screen printing with a conductive paste. That is, each of the plurality of second thick-film conductors need not necessarily be separately formed. The second thick-film conductors may be integrally formed.

Specific examples will be described below.

FIRST EXPERIMENTAL EXAMPLE

The piezoelectric actuator 11 according to the second embodiment was produced by the following procedure.

A Ag powder, a $B_2O_3$—$SiO_2$—CaO-based glass frit, ethyl cellulose as an organic resin binder, and terpineol as an solvent were mixed with a three-roll mill to form a conductive paste. The total solid content of Ag and the glass frit relative to the conductive paste was set at 80 percent by weight.

A multilayer piezoelectric component 2 having a size of 7 mm×7 mm×35 mm and composed of a PZT ceramic material was prepared. The conductive paste was applied by screen printing to the top face 2a and the bottom face 2b of the multilayer piezoelectric component 2 so as to have an outer size of 5 mm×31 mm after baking. After the conductive paste was dried, the same conductive paste was applied by screen printing so as to form the second thick-film conductors 18a to 18d having a rectangular frame-like shape. In this case, the conductive paste was applied by printing in such a manner that the outer size of the rectangular frame-like shape in plan was 4.5 mm×30 mm and that the width of a frame portion was 1.5 mm after baking.

A Ag gauze as the conductive reinforcer 9 having a rectangular shape with a size of 4 mm×28 mm in plan, a wire-diameter of 150 μm, and a mesh opening of 40 was placed. The conductive paste to be formed into the second thick-film conductor was dried by heating.

The conductive paste to be formed into each of the first and second thick-film conductors was baked to form the external conductors 15 and 16.

For comparison purposes, a piezoelectric actuator as a known example was prepared in the same way as above, except that the external conductor was formed by applying the conductive paste for forming the first thick-film conductor by screen printing, embedding the Ag gauze, and baking the conductive paste. The piezoelectric actuator as the known example did not have the second thick-film conductor.

Cu leads each having a wire diameter of 250 μm and covered with enamel were bonded to the piezoelectric actuators according to the second embodiment and known example by soldering with Sn-3Ag-0.5Cu solder at a temperature of 350° C. Furthermore, to impart piezoelectric characteristics, the multilayer piezoelectric components 2 were subjected to polarization treatment.

Each of the resulting piezoelectric actuators according to the second embodiment and known example for comparison was driven 100 times by passing a current with a frequency of 30 Hz at a voltage of 200 V. Then the amount of displacement after polarization treatment was measured. The average value of the amount of displacement obtained by 100 operations was defined as the amount of initial displacement.

The piezoelectric actuator having an amount of initial displacement of 40 μm or more was defined as a non-defective actuator. The number N of samples was set at five in each of the second embodiment and the comparative example.

After the amount of initial displacement was measured, a current applying test was repeated at a voltage of 200 V and a frequency of 200 Hz. The number of driving cycles when the actuator was destroyed was determined. To suppress excessive displacement during operation, each piezoelectric actuator was held by metal plates. After the above-described driving test was performed, the amount of displacement was measured in the same way as in the amount of initial displacement. The sample having an amount of displacement of 40 μm or more after the driving test was defined as a non-defective sample. The number N of samples was set at three.

Table 1 shows the results.

TABLE 1

| | Initial property | | Number of | After driving test | |
|---|---|---|---|---|---|
| | Amount of displacement (μm) | Capacitance (μF) | driving cycle (cycle) | Amount of displacement (μm) | Capacitance (μF) |
| Known example | 47.3 | 4.1 | $3.6 \times 10^8$ | 35.4 | 3.03 |
| Embodiment | 47.1 | 4.09 | $5.0 \times 10^8$ | 45.5 | 3.96 |

In the piezoelectric actuator according to the known example, there were no problem of the amount of initial displacement and capacitance. However, when the driving test was performed, the actuator was stopped at the number of driving cycles of less than $5.0 \times 10^8$, in some cases. After the driving test, the amount of displacement and capacitance were reduced. Observation of the appearance of the sample after the driving test showed that the external conductor was cracked along a crack formed in the external conductor during polarization treatment and that the embedded Ag gauze was broken.

The broken Ag gauze or the like causes discharge, thereby possibly resulting in the termination of operation and the reduction in the amount of displacement.

In contrast, in the piezoelectric actuator according to the second embodiment, the amount of displacement and capacitance were sufficient even after the driving test. Observation of the appearance after the driving test showed that the thick-film conductor was cracked but that the Ag gauze was not broken because the Ag gauze was not markedly restricted to the thick-film conductor. Therefore, it was found that the conduction of the external conductor in the planar direction was sufficiently ensured.

SECOND EXPERIMENTAL EXAMPLE

Five types of conductive paste were prepared by changing the solid content within 75.0 to 95.0 percent by weight as shown in Table 2, the solid content being defined as the total content of the Ag powder and the glass frit in the conductive paste prepared in the first experimental example. Piezoelectric actuators were produced with the five types of conductive paste as in the first experimental example.

In the same way as in the first experimental example, leads were bonded with solder to the resulting piezoelectric actuators. After polarization treatment was performed, adhesive strength between the external conductor and the piezoelectric component was measured with a tensile and compression test machine (Model SV-201, produced by Imada manufacturing Co., Ltd.) by applying an external force so as to move the lead away from the multilayer piezoelectric component 2. The tension rate was set at 20 mm/minute. The number N of samples was set at 10. Table 2 shows the results.

TABLE 2

| Sample | Solid content of paste (wt %) | Adhesive strength (N) |
|---|---|---|
| 1 | 75.0 | 10.3 |
| 2 | 80.0 | 24.6 |
| 3 | 85.0 | 46.5 |
| 4 | 90.0 | 43.2 |
| 5 | 95.0 | 45.1 |

Table 2 clearly shows that Samples 3 to 5 each having a solid content of the conductive paste of 85 to 95 percent by weight have high adhesion strength compared with other Samples. This may be because Samples 1 and 2 each having a solid content of 80 percent by weight or less each have a large amount of shrinkage when the conductive pastes were dried and baked, thereby reducing denseness of each thick-film conductor. At a solid content exceeding 95 percent by weight, a conductive paste could not be formed.

In each of the above-described embodiments, the metal gauze composed of Ag or the like is used. Alternatively, for example, a conductive reinforcing plate in which many holes are formed in a thin metal plate may be used. That is, the shape of the conductive reinforcer is not particularly limited. The metal constituting the conductive reinforcer is not limited to Ag. Alternatively, a metal such as Cu or Al or any of various alloys may be used.

The invention claimed is:

1. A piezoelectric actuator comprising:
a piezoelectric component having a plurality of piezoelectric ceramic layers and a plurality of internal electrodes;
an external conductor arranged on at least a first surface of the piezoelectric component and connected to the internal electrodes, external conductor comprising:
a planar-shaped first conductor film arranged on at least the first surface of the piezoelectric component; and
a second conductor film arranged on and in surface-contact with part of the first conductor film; and
a conductive reinforcer attached to a surface of the second conductor film so as not to be in direct contact with the first conductor film,
wherein the first and second conductor films are arranged such that a peripheral line of the second conductor is located inside a peripheral line of the first conductor, and wherein the first and second conductor films are baked metal and glass thick film conductor films.

2. The piezoelectric actuator according to claim 1, wherein the first conductor film has a thickness larger than that of the second conductor film.

3. The piezoelectric actuator according to claim 1, wherein each of the first and second conductor films are formed from a conductive paste containing a metal powder, a glass frit, and an organic vehicle, wherein the total content of the metal powder and the glass frit is in the range of 85 to 95 percent by weight relative to the conductive paste.

4. The piezoelectric actuator according to claim 1, wherein the second conductor film is formed from a plurality of second conductor films arranged in a frame-like shape.

5. The piezoelectric actuator according to claim 4, wherein the plurality of second conductor films are four strip-shaped conductor films arranged to have a rectangular frame-like shape.

6. The piezoelectric actuator according to claim 1, wherein the second conductor film is formed from a plurality of second conductor films arranged in a polygonal frame-like shape.

7. The piezoelectric actuator according to claim 1, wherein a step is formed inside a peripheral line of the external conductor.

8. The piezoelectric actuator according to claim 2, wherein the second conductor film is formed from a plurality of second conductor films arranged in a frame-like shape.

9. The piezoelectric actuator according to claim 8 herein the plurality of second conductor films are four strip-shaped conductor films arranged to have a rectangular frame-like shape.

10. The piezoelectric actuator according to claim 8, wherein the second conductor film is formed from a plurality of second conductor films arranged in a polygonal frame-like shape.

11. The piezoelectric actuator according to claim 2, wherein a step is formed inside a peripheral line of the external conductor.

12. The piezoelectric actuator according to claim 1, wherein the longitudinal extent of the first conductor is greater than the longitudinal extent of the second conductor.

13. The piezoelectric actuator according to claim 12, wherein all of the peripheral lines of the second conductor are located inside the peripheral lines of the first conductor.

14. The piezoelectric actuator according to claim 2, wherein all of the peripheral lines of the second conductor are located inside the peripheral lines of the first conductor.

15. The piezoelectric actuator according to claim 2, wherein each of the first and second conductor films are formed from a conductive paste containing a metal powder, a glass frit, and an organic vehicle, wherein the total content of the metal powder and the glass frit is in the range of 85 to 95 percent by weight relative to the conductive paste.

16. The piezoelectric actuator according to claim 15, wherein the second conductor film is formed from a plurality of second conductor films arranged in a frame-like shape.

17. The piezoelectric actuator according to claim 1, wherein the conductive reinforcer is in the form of a mesh.

18. The piezoelectric actuator according to claim 17, wherein the first conductor film has a thickness larger than that of the second conductor film.

19. The piezoelectric actuator according to claim 18, wherein the second conductor film is formed from a plurality of second conductor films arranged in a frame-like shape.

20. The piezoelectric actuator according to claim 17, a wherein a step is formed inside a peripheral line of the external conductor.

* * * * *